United States Patent [19]
Labrum et al.

[11] Patent Number: 4,636,718
[45] Date of Patent: Jan. 13, 1987

[54] ACOUSTO-OPTICAL SPECTRUM ANALYZER WITH EXPANDED FREQUENCY RESOLUTION

[75] Inventors: Joseph H. Labrum, West Jordan; Allen D. Wilcox, Bountiful, both of Utah

[73] Assignee: Sperry Corporation, Blue Bell, Pa.

[21] Appl. No.: 632,728

[22] Filed: Jul. 20, 1984

[51] Int. Cl.$^4$ ................ G01R 23/165; G01R 23/17
[52] U.S. Cl. .............................. 324/77 K; 324/77 E
[58] Field of Search ............... 324/77 B, 77 E, 77 G, 324/77 K; 329/144; 350/358; 364/821, 822; 381/29; 356/308, 328

[56] References Cited

U.S. PATENT DOCUMENTS

| | | | |
|---|---|---|---|
| 3,355,579 | 11/1967 | Robertson | 324/77 K |
| 3,942,109 | 3/1976 | Crumly et al. | 324/77 K |
| 4,163,205 | 7/1979 | Barron | 324/77 K |

FOREIGN PATENT DOCUMENTS 0018150 10/1980 European Pat. Off. ............. 350/358

OTHER PUBLICATIONS

Drentea, C., *Radio Communications Receivers*, 1982, pp. 273–277.

*Primary Examiner*—Stewart J. Levy
*Assistant Examiner*—Kevin D. O'Shea
*Attorney, Agent, or Firm*—G. Donald Weber, Jr.; Glenn W. Bowen

[57] ABSTRACT

This invention is directed to a spectrum analyzer system which is laser-driven and which includes a standard Bragg cell and a standard photo-diode array as the output detector. In this system, the Bragg cell is driven by a bandwidth expansion circuit which receives the typical R.F. input signal, supplies it to a variable center frequency filter or to a bank of filters which then down-converts the signal and supplies the signal to a real time signal storage memory at a first signal rate. The signals are retrieved from the memory at a second, much greater signal rate, up-converted and supplied to the Bragg cell to affect the operation thereof in the usual fashion. This time base compression circuit has the effect of producing an improved optical spectrum analyzer with expanded frequency resolution.

14 Claims, 3 Drawing Figures

ACOUSTO-OPTICAL SPECTRUM ANALYZER WITH EXPANDED FREQUENCY RESOLUTION

BACKGROUND

1. Field of the Invention

This invention is directed to frequency spectrum analyzers, in general, and to optical spectrum analyzers, in particular, and especially spectrum analyzers having improved frequency resolution characteristics.

2. Prior Art

There are many optical spectrum analyzers which are known in the art. These systems frequently use light sources which provide a light beam which is operated upon by various optical elements, such as and including, a so-called Bragg cell (a type of acousto-optic cell). The Bragg cell produces output light beams which are representative of the analog (R.F.) signal activating the Bragg cell. The output signal from the Bragg cell is, typically, applied to a photo-diode array (directly or through other optical devices) where the light beam is detected and electrical signals are produced. These electrical signals are then operated upon by subsequent detection circuitry.

However, in the known systems, the frequency resolution and the bandwidth of the systems are both quite small. Various attempts have been made to improve the resolution of this signal detection. However, most of these attempts have been very expensive or have created other problems in the signal processing operation. For example, in the past it has been attempted to improve the frequency resolution of the system by increasing the length of the Bragg cell in order to extend the frequency resolution of the optical system. However, this approach is not especially productive inasmuch as the extended length of the Bragg cell has the inherent effect of substantially attenuating the R.F. signal which is supplied thereto whereby distortion of the optical output frequency signal is produced. Also, such elongated Bragg cells become very expensive, delicate to handle, and hard to package in many systems.

As is known in prior art systems, the limiting factor of frequency resolution in a laser-driven spectrum analyzer is usually the aperture size of the Bragg cell. In current technology, the aperture size is about 10 microseconds which converts to a resolution of 100 KHz. In order to increase the resolution by a factor of 10, it would appear necessary to increase the Bragg cell aperture to about 100 microseconds. However, this has the very distinct drawback of attenuation of the input R.F. signal, as noted above.

In addition, if greater frequency resolution is achieved in the existing systems, a relatively large bandwidth operation is required of the system and expensive (and currently unavailable) photo-diode arrays would be needed at the output of the analyzer. For example, to break a ten times wider bandwidth signal into 100 KHz frequency resolution segments would require ten times the original number of photo-diodes in the photo-diode array which can amount to a very large, unwieldy array.

In the prior art known to date, the best frequency resolution which has been obtainable is approximately 100 KHz. Even if the known systems are optimized for the best possible achievable frequency resolution, the resolution can only be improved to 50 KHz or possibly 25 KHz resolution. In an exemplary system, the bandwidth is in the range of 100 MHz. That is, the system operates in the range of 100 MHz to 200 MHz and requires a minimum of a thousand individual pixels or photo-diodes in the output array to provide a 100 KHz frequency resolution.

It would be highly advantageous to be able to select a narrower bandwidth, on the order of 10 MHz, and to obtain 10 KHz resolution. In other words, it would be highly desirable to increase the resolution by a factor of 10 while decreasing the bandwidth by a factor of 10. This situation would allow greater resolution for more precise definition of signals by the analyzer. Obviously, the greater definition and resolution of the signals, the more readily the system can distinguish between closely spaced signals. Additionally, it would be advantageous to now widen the frequency bandwidth back to the original 100 MHz bandwidth by time-sharing the single photo-diode array with each of ten separate 10 MHz wide segments in the 100 MHz total bandwidth. This would preclude the need for more photo-diodes in the photo-diode array, but would still provide continuous time monitoring of the 100 MHz wide analog (R.F.) signal.

SUMMARY OF THE INVENTION

This invention is directed to a spectrum analyzer system which is laser-driven and which includes a standard Bragg cell and a standard photo-diode array as the output detector. However, in this system, the Bragg cell is driven by a bandwidth expansion circuit which receives the typical R.F. input signal, supplies it to a variable center frequency filter or to a bank of filters which then down-converts the signal and supplies the signal to a real time signal storage memory at a first signal rate. The signals are retrieved from the memory at a second, much greater signal rate, up-converted and supplied to the Bragg cell to affect the operation thereof in the usual fashion. This time base compression circuit has the effect of producing an improved optical spectrum analyzer with expanded frequency resolution. Also, since the stored signal is retrieved at a much faster rate than the rate at which it was initially stored, the optical spectrum analyzer has a large amount of idle time which can be used for analyzing the other segments of the original signal bandwidth using multiple filters with multiple storage memory units.

DESCRIPTION OF A PREFERRED EMBODIMENT

Figure 1:
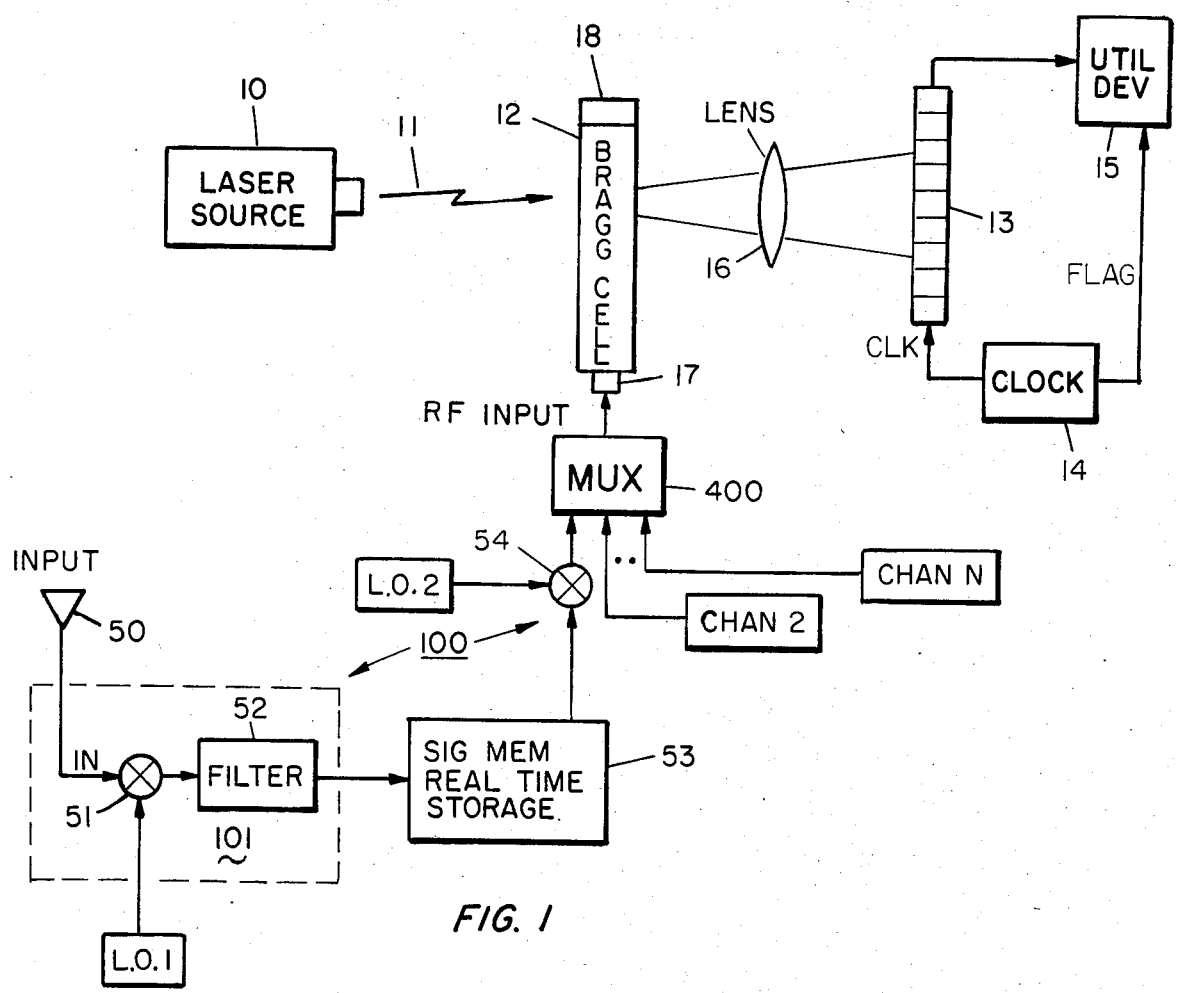
FIG. 1 is a block diagram of the improved optical spectrum analyzer of the instant invention.

Referring now to FIG. 1, there is shown a block diagram representation of a spectrum analyzer in accordance with the instant invention. In this system, laser source 10 provides a collimated, coherent beam of light 11 to Bragg cell 12. Bragg cell 12 operates on light beam 11 and produces the output signal thereof and supplies same to the photo-diode array 13. A clock source 14 supplies a clock signal (CLK) to the diode array for selective sampling of the diodes in the array. In addition, clock source 14 provides a flag signal (FLAG) which is used to control the external circuitry represented by a utilization device 15 (UTIL DEV) to operate upon the signal from array 13. In some cases, an optical system such as a lens 16 is inserted between Bragg cell 12 and diode array 13. Typically, the lens 16 is a Fourier transform lens. The Bragg cell 12 is arranged to receive an R.F. input signal at the input terminal 17 thereof. An acoustic signal absorbing terminal 18 is located at the opposite end of the Bragg cell.

This portion of the optical system is well known in the prior art. A typical description is found in the copending application entitled ACOUSTO-OPTIC R-F RECEIVER WHICH IS TUNABLE AND HAS ADJUSTABLE BANDWIDTH, by J. H. Labrum, filed on Dec. 28, 1983, bearing Ser. No. 566,437 and assigned to the common assignee.

As shown in FIG. 1, the R.F. signal supplied to Bragg cell 12 is supplied by a bandwidth expansion circuit 100. The bandwidth expansion circuit 100 receives the input controlling signal from a suitable source 50 which may be an antenna or the like. The source 50 is connected to a down-converter circuit 51 which can be any type of mixer circuit or the like. The down-converter 51 also receives a control signal L01 from a local oscillator and mixes the signal L01 with the input signal IN supplied by source 50. The output of the signal from the mixer 51 is supplied to a bandpass filter 52. Filter 52 is, preferably, a constant bandwidth filter which has the effect of removing unnecessary and/or undesirable signals which are supplied by the mixer. The combination of the input signal, the mixer 51 and the filter 52 can be referred to as a variable center frequency filter 101, shown within the dashed outline.

The output signal from filter 52 is supplied to a storage means 53. The storage means is a signal memory, real time, storage mechanism which receives and stores the signals supplied thereto by filter 52.

The output of the memory 53 is supplied to one input of an up-converter 54 the output of which is connected to supply the R.F. input signal to the Bragg cell 12 via a multiplexer 400 as described infra. The other input to up-converter 54 is supplied by a second local oscillator L02 of a relatively high frequency, for example on the order of 100 MHz in a preferred embodiment. Up-converter 54 is, typically, a mixer type circuit.

In operation, laser source 10, Bragg cell 12, Fourier transfer lens 16 and photo-diode array 13 operate in the standard fashion as described in the prior art. However, in the improved system of this invention, the input signal supplied by source 50 is in the range of 100 MHz to 200 MHz. This signal is supplied to mixer 51 which receives a local oscillator signal L01 which has a frequency on the order of 100 MHz to 190 MHz. The mixer 51 operates to combine these signals in a standard fashion so as to produce an output signal on the order of 0 to 10 MHz. This signal is supplied to filter 52 which has a constant bandwidth and removes (or blocks) those signals which are not within the bandwidth. Typically, the output signal from filter 52 is on the order of 10 MHz. This signal is supplied to the real time storage device 53 and stored in real time.

After the signals have been stored in storage device 53, they are supplied to up-converter 54 at a much higher rate of speed than the read-in speed. In a typical case, the read-out rate is 10 times the read-in rate. As a result, the R.F. signal input to up-converter 54 is, in this embodiment, on the order of 100 MHz. This 100 MHz bandwidth signal is combined with the local oscillator signal L02 at up-converter 54 so that the R.F. signal supplied to the input terminal of the Bragg cell 12 is on the order of 100 MHz to 200 MHz.

Thus, the signal supplied by the storage device 53 effectively produces a bandwidth expansion which is of the same multiple as the input-to-output frequencies, per se. Thus, if two input frequencies of 1 KHz and 10 KHz are present in the input signal and each is multiplied by a factor of 10, the output frequencies are 10 KHz and 100 KHz. Obviously, the frequencies are ten times higher. In addition, the original frequency spread is 9 KHz while the multiplied frequency spread is 90 KHz. Thus, a greater difference between the frequencies is achieved so that greater discrimination and, thus, resolution therebetween can be achieved. Moreover, if the speed multiplying factor is 100, the discrimination factor is even greater with 900 KHz frequency spread between the two original input signals.

Figure 2:
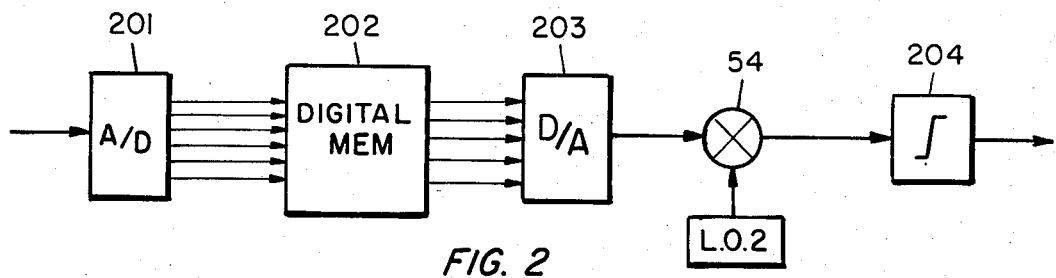
FIGS. 2 and 3 are block diagram representations of certain embodiments of the memory shown in FIG. 1.

Referring now to FIG. 2, there is shown one embodiment of the storage device 53 shown in FIG. 1. In this case, the storage device comprises an A/D converter 201 at the input terminal thereof to receive a signal on the order of 1 MHz from the variable center frequency filter 101. The A/D 201 converts the analog signals to digital signals and supplies digital signals to a digital memory 202 of known configuration. The outputs of digital memory 202 are connected to the inputs of a D/A converter 203 of known configuration. In one embodiment, the input sample rate can be on the order of 10 MHz. The output sampling rate for the digital memory can be 100 MHz. Thus, a sampling rate increase of 10 fold is achieved.

The output signal from the D/A converter 203 is then supplied to the input terminal of the up-converter 54 which also receives local oscillator signal L02 which is on the order of 100 MHz. The mixed signal is then supplied to a filter 204 from whence signals are supplied to the Bragg cell 12 to effect the operation thereof.

Figure 3:
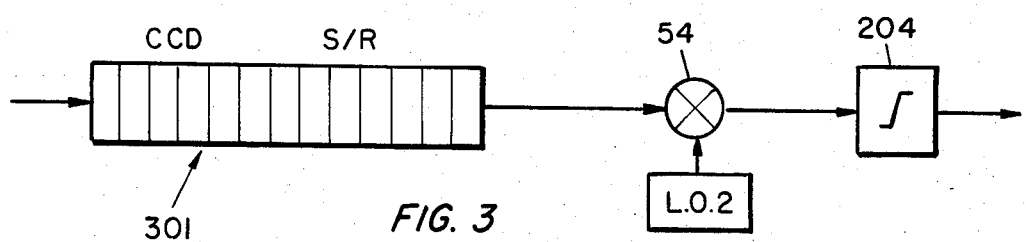

Referring now to FIG. 3, there is shown another embodiment of the storage device. In this case, a charge coupled device (CCD) shift register 301 is provided. The input signal is supplied at the rate of 1 MHz and is stored in the CCD shift register at the incoming rate. The signals are then shifted out of the register 301 at some multiple (in the examples given, this multiple would be 10 or 100) of the input frequency to effect the high-speed-burst of signal information from the storage register 301. The output from the storage register 301 is supplied to the up-converter 54 and the filter 204 as described above.

Returning now to FIG. 1, there is shown a multiplexer 400 which is usually used in one embodiment of the invention. That is, if an extremely wide bandwidth signal is desired, several channels such as those described can be provided. There can be several storage devices, local oscillators, filters and the like, all arranged in separate channels connected to supply signals to the MUX 400 and, selectively, applied to the Bragg cell 12 via MUX 400 to provide wide range operations thereof. Since the output from the storage registers 53 is fed to the Bragg Cell in a high-speed-burst, multiple stored signals can be fed out, one after another, with no loss of real time signal information.

Thus, there is shown and described an improved optical spectrum analyzer which has an expanded frequency resolution capability. The system is far superior to existing analyzers or similar types of optical signal processing systems. The system permits high resolution of optical signals in such a fashion that wide bandwidth operation can be retained through appropriate electronic control circuitry. The embodiments shown and described are directed to typical kinds of elements and/or components. As well, illustrative signal frequencies have been described. It should be understood that this description is illustrative only and is not limitative to the invention. Modifications thereto will be suggested to those skilled in the art and any such modifications which fall within the purview of this description are to be included therein as well. For example, the real time storage device could be of the type described or it could be a tape recorder which has a slow read-in and a fast read-out or the like.

As noted, the scope of the invention is not to be limited by the description presented herewith. Rather, the scope of the invention is to be determined only by the claims appended hereto.

We claim:

1. An acousto-optical spectrum analyzer comprising,
   first source means for providing an electromagnetic wave,
   acousto-optic cell means for operating on said electromagnetic wave, optical means disposed intermediate said acousto-optic cell and said detector means to operate on focusing of said electromagnetic wave,
   dectector means for detecting said electromagnetic wave after operation thereon by said acousto-optic cell,
   bandwidth expansion means connected to said acousto-optic cell to control the operation thereof,
   said bandwidth expansion means including storage means capable of a rate of read-out which is higher than the rate of read-in,
   first oscillator means,
   first mixer means for combining the signal from said first oscillator means and the output signal from said storage means to produce a control signal to be applied to said acousto-optic cell means,
   second source means for providing an R.F. input signal,
   second oscillator means, and
   second mixer means for combining the signal from said second source means and the signal from said second oscillator means to produce an input signal to be stored in said storage means.
2. The analyzer recited in claim 1 wherein,
   said electromagnetic wave is an optical frequency transform.
3. The analyzer recited in claim 2 wherein,
   said detector means disposed to operate at the Fourier transform plane of said electromagnetic wave.
4. The analyzer recited in claim 1 wherein,
   said bandwidth expansion means supplies an RF input signal to said acousto-optic cell.
5. The analyzer recited in claim 1 wherein,
   said acousto-optic cell means is a Bragg cell.
6. The analyzer recited in claim 1 wherein,
   said source means comprises a laser.
7. The analyzer recited in claim 1 wherein,
   said detector means comprises a photo-diode array.
8. The analyzer recited in claim 1 including,
   multiplexer means connected to said acousto-optic cell to selectively connect portions of said bandwidth expansion means to said acousto-optic cell.
9. The analyzer recited in claim 1 wherein,
   said storage means comprises a memory device.
10. The analyzer recited in claim 9 wherein,
    said memory device is a digital memory.
11. The analyzer recited in claim 10 including,
    analog to digital converter means connected to the input of said digital memory, and
    digital to analog converter means connected to the output of said digital memory.
12. The analyzer recited in claim 1 including,
    filter means connected between said second mixer means and said storage means.
13. The analyzer recited in claim 1 wherein,
    said storage means comprises a charge coupled device (CDC).
14. The analyzer recited in claim 1 wherein,
    said bandwidth expansion means includes a variable center frequency filter means.

* * * * *